US006657287B2

(12) United States Patent
Smith et al.

(10) Patent No.: US 6,657,287 B2
(45) Date of Patent: Dec. 2, 2003

(54) LEADFRAME ASSEMBLY

(75) Inventors: Ronald M. Smith, Mokena, IL (US); Robert J. Cook, New Lenox, IL (US); Steven R. Benson, Channahon, IL (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 10/139,007

(22) Filed: May 3, 2002

(65) Prior Publication Data

US 2003/0205788 A1 Nov. 6, 2003

(51) Int. Cl.$^7$ ............................................ H01L 23/495
(52) U.S. Cl. ........................ 257/666; 257/674; 257/692; 257/727
(58) Field of Search ................................. 257/666, 674, 257/673, 692, 727

(56) References Cited

U.S. PATENT DOCUMENTS 5,541,376 A * 7/1996 Ladtkow et al. ............ 200/284
6,047,468 A * 4/2000 Fogal et al. .................. 29/827

* cited by examiner

Primary Examiner—Roy Potter
(74) Attorney, Agent, or Firm—Mark W. Croll; Paul F. Donovan

(57) ABSTRACT

A leadframe having component receiving projections, such as electrical connectors, adapted to receive a component thereon, such as a ferrite filter, and having means for securing the position of the component on the leadframe during premold or overmold processes.

20 Claims, 3 Drawing Sheets

LEADFRAME ASSEMBLY

FIELD OF THE INVENTION

The present invention pertains generally to molding methods for sensitive members, such as electrical elements, and more particularly to leadframe structures for retaining components in proper position on the leadframe prior to a premolding and/or an overmolding process, so that the component can be included in the premold or overmold.

BACKGROUND OF THE INVENTION

In various industries, it is known to provide non-plastic components imbedded in plastic bodies, to increase durability and performance of the components. For example, it is known to provide various electrical components embedded in plastic, with contact portions thereof extending outwardly of the plastic body, to connect to an electrical circuit. By exposing only the necessary contacts, the remaining embedded portions of the component can be protected from harsh ambient conditions, from physical contact that could result in damage, from jarring that may impair proper function, or other undesirable exterior conditions.

A known process to provide electrical components embedded in plastic includes the formation of a leadframe of conductive metal, the formation of a premold over some parts of the leadframe, and the subsequent formation of an overmold over some or all of the leadframe, and over some or all of the premold.

The leadframe includes a central frame of permanent components in the finished product, and may further include an outer frame or hoop to stabilize the central frame during premolding and/or overmolding processes. Parts of the outer frame are removed after premolding and/or overmolding.

Premolding/overmolding processes as described above are used to protect sensitive elements from ambient conditions and to prevent contamination or damage during use. In the manufacture of some products, it is necessary to provide various other components separately attached or connected to the leadframe. Advantages can be obtained for some such assemblies if the component can be assembled on the leadframe prior to premolding or overmolding, so that the component can be encapsulated as well, during the premolding and/or overmolding processes. However, doing so is not without difficulties, as the component must be secured in position relative to the leadframe. If the component is positioned improperly, failure of the molding process and/or the resulting molded part can result.

Retaining a component properly positioned on a leadframe can be achieved with stops, lands or holding devices in the mold, but the use of such can result in a non-hermetic seal around the component. It also can be more difficult to assemble and position the components in the mold, making manufacture more difficult. Assembling the component on the leadframe when the leadframe is positioned in the mold can be awkward and time consuming, slowing the molding process. If the component is merely placed on the leadframe in advance of sending the leadframe to the molding step, the component can become displaced on the leadframe, separated from the leadframe or lost entirely.

What is needed in the art is a structure integral with the leadframe, for retaining components in proper position on the leadframe prior to a premolding and/or an overmolding process.

SUMMARY OF THE INVENTION

The present invention provides a leadframe structure that secures components thereon, to maintain the position of the component on the leadframe during a premolding and/or overmolding process. The structure allows pre-assembly of the leadframe with the component, thereby facilitating subsequent premolding and/or overmolding processes In one aspect thereof, the invention provides a leadframe with a central frame and at least one component receiving projection from the central frame. A biasing member is associated with the component receiving projection, adapted and arranged to operate on a component installed on the component receiving projection. A locking means is associated with the biasing member to inhibit movement of the component on the component receiving projection under biasing influence of the biasing member.

In another aspect of the invention, a leadframe assembly is provided with a leadframe including a central frame, and at least one component receiving projection from the central frame. A component is installed over the component receiving projection. A biasing member associated with the component receiving projection is adapted and arranged to operate on the component installed on the component receiving projection. A locking means associated with the biasing member inhibits movement of the component on the component receiving projection under biasing influence of the biasing member.

In still another aspect thereof, the invention provides a leadframe assembly with a leadframe including a central frame, an outer frame at least partially surrounding the central frame and connected to the central frame by at least one bridge for reinforcing the central frame, and at least one electrical contact projecting outwardly from the central frame. The contact is a monolithic structure having a base and a biasing member overlying the base. The biasing member is connected to the base along distal segments thereof, and is formed to overlie the base along a fold. The biasing member has a proximal segment free from the base, and a protuberance extending laterally of the base. A shoulder is formed at an end of the fold, disposed laterally beyond an edge of the base. A ferrite noise filter is installed over the contact, the filter having a hole minimally larger than the contact. The filter is disposed on the contact between the central frame and the shoulder. The protuberance and the proximal segment of the biasing member bias the filter to maintain positioning of the filter between the shoulder and the central frame.

An advantage of the present invention is providing a leadframe structure with an additional component thereon, facilitating subsequent premolding and/or overmolding processes by ensuring proper positioning of the component on the leadframe.

Another advantage of the present invention is providing a leadframe assembly with a component mounted and secured thereon, allowing encapsulation of the component during premolding and/or overmolding.

A further advantage of the present invention is providing a leadframe assembly with a noise filter on electrical contacts of the leadframe, with plastic encapsulating the filter and selected portions of the leadframe.

Other features and advantages of the invention will become apparent to those skilled in the art upon review of the following detailed description, claims and drawings in which like numerals are used to designate like features.

Figure 1:
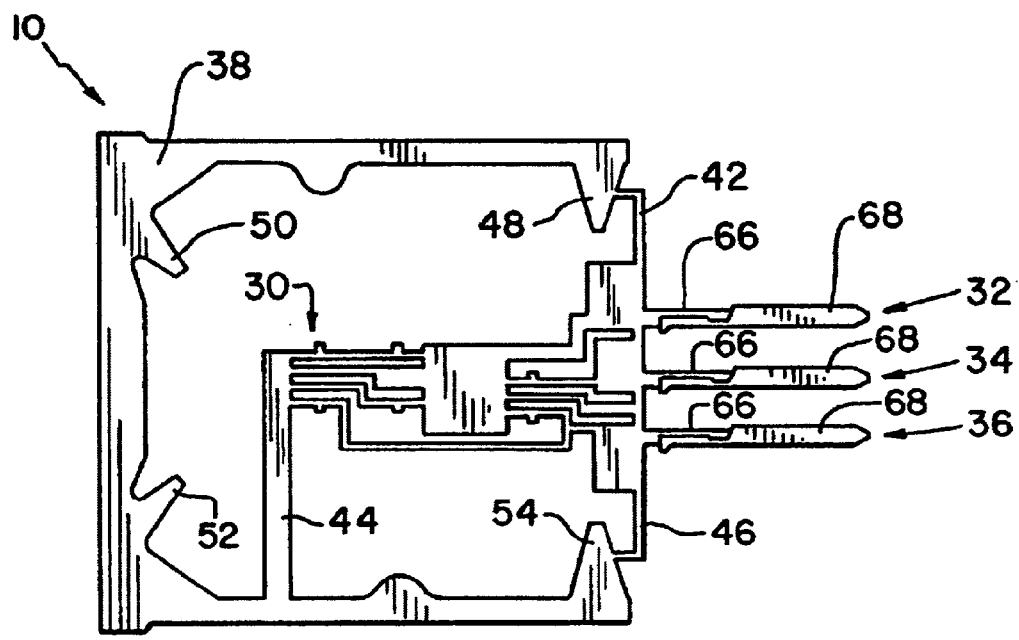
FIG. 1 is a plan view of a leadframe according to the present invention.

Before the embodiments of the invention are explained in detail, it is to be understood that the invention is not limited in its application to the details of construction and the arrangements of the components set forth in the following description or illustrated in the drawings. The invention is capable of other embodiments and of being practiced or being carried out in various ways. Also, it is understood that the phraseology and terminology used herein are for the purpose of description and should not be regarded as limiting. The use of "including" and "comprising" and variations thereof herein is meant to encompass the items listed thereafter and equivalents thereof as well as additional items and equivalents thereof.

DETAILED DESCRIPTION OF THE PREFERRED EMBODIMENT

Referring now more specifically to the drawings, and to FIG. 1 in particular, numeral 10 designates a leadframe of the present invention. Leadframe 10 of the present invention is useful in completing a leadframe assembly 12 (FIG. 6), including leadframe 10 and a component 14 (FIG. 2) installed thereon. In the example illustrated, component 14 is a ferrite noise filter, but in other applications of the present invention could be other components that can be installed advantageously on leadframe 10.

Figure 2:
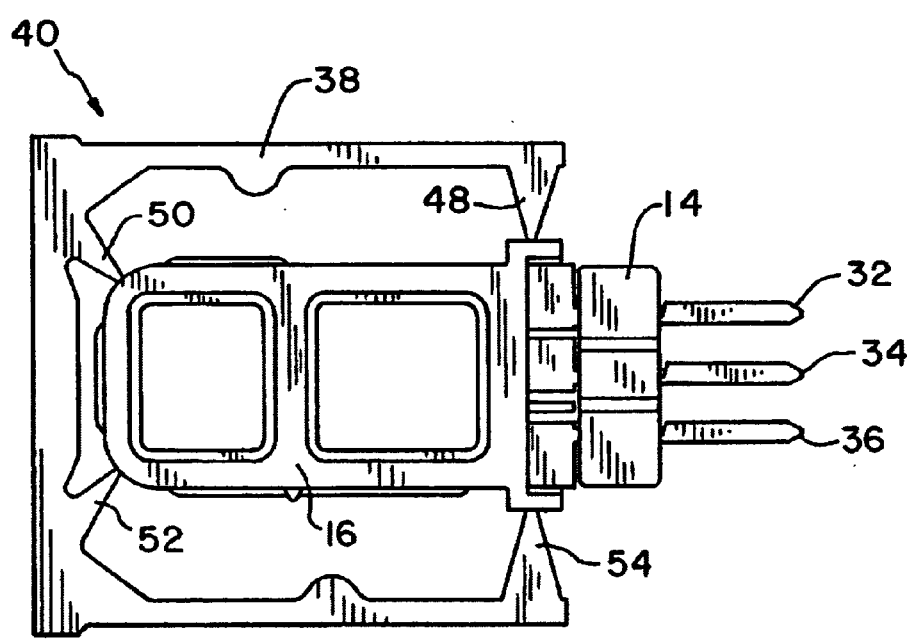
FIG. 2 is a plan view of the leadframe shown in FIG. 1, after a premolding step in the formation of a leadfiame assembly.
Figure 6:
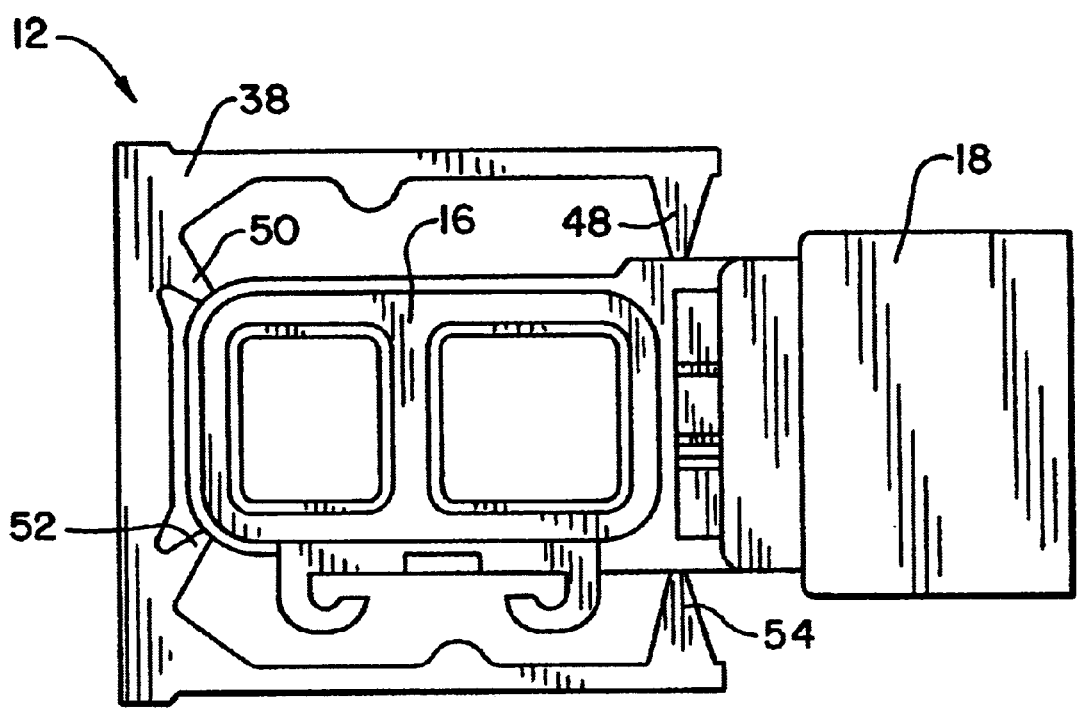
FIG. 6 is a plan view of the leadframe assembly after completion of an overmolding process.

Leadframe assembly 12 includes leadframe 10, a premold 16, best seen in FIG. 2, and an overmold 18, best seen in FIG. 6. Premold 16 is injection molded plastic encasing selected portions of leadframe 12, and overmold 18 is injection molded plastic encasing other selected portions of leadframe 12, as well as selected portions of premold 16. As depicted in the drawings, leadframe assembly 12 has a specific configuration and use; however, those skilled in the art will recognize that the concepts disclosed herein have wide ranging application for variously configured leadframes, with numerous components useful in other electrical systems. The present invention is not limited to the specific leadframe 10 or ferrite filter component 14 shown, nor to the premold 16 or overmold 18 configurations illustrated.

Leadframe 10 is an electrically conductive body, normally metal, formed by stamping or the like. Leadframe 10 includes a central frame 30, three electrical contacts 32, 34 and 36, and an outer frame 38. Central frame 30 defines the desire electrical circuit for the device being formed, and may include a plurality of sites at which other electrical components (not shown) are later attached or electrically connected. Electrical contacts 32, 34 and 36 extend out of premold 16 and overmold 18, and provide the desired site for electrical connection of leadframe assembly 12 to electric leads or another device (not shown).

Premold 16 is formed in known manner by accurately positioning leadframe 10 in a mold of an injection molding machine (not shown), and applying plastic to selected portions thereof in the form of the desired shape of premold 16. Thus, selected portions of leadframe 10 are covered or encapsulated in plastic by the application of premold 16, and a desired outer configuration is achieved. An intermediate structure 40 of leadframe assembly 12, that includes leadframe 10 with premold 16 applied thereto, is illustrated in FIG. 2.

Also in known manner, overmold 18 is formed by accurately positioning intermediate structure 40 in another mold of an injection molding machine (not shown), and applying additional plastic thereto in the form and the shape desired for the final leadframe assembly. In so doing, other selected portions of leadframe 10 and/or selected portions of premold 16 are covered or encapsulated in plastic by the application of overmold 18, and a desired final outer configuration is achieved.

In some structures of leadframe assembly 12, outer frame 38 is provided primarily for increased strength and rigidity of central frame 30, and to assist in positioning and securing leadframe 12 in the molds for applying premold 16 and overmold 18. In other structures of leadframe assembly 12, outer frame 38, or portions thereof, may have utility in the final use, installation or application of assembly 12. Thus, selected portions or all of outer frame 38 may be removed after premold 16 and/or outermold 18 are applied. A plurality of bridges 42, 44, 46 are provided between outer frame 38 and central frame 30, three such bridges 42, 44 and 46 being illustrated in FIG. 1. During the formation of premold 16, the plastic thereof can be made to join with one or more legs 48, 50, 52, 54 of outer frame 38, four such legs 48, 50, 52 and 54 joined to premold 16 being shown in FIG. 2. Some or all of bridges 42, 44 and 46 can then be severed between the formation of premold 16 and overmold 18, while continuing to also maintain the support of central frame 30 by outer frame 38. In this way, after removal of outer frame 38, all exposed electrical paths to central frame 30 are limited to those desired, such as contacts 32, 34 and 36, with no other exposed pathways.

Premolding/overmolding processes as described above are well-known to those skilled in the art, and will not be described in greater detail herein.

In some premolding/overmolding processes, for the creation of specific leadframe assemblies 12, it is desirable or advantageous to include components 14 installed on leadframe 12 in the formation of premold 16 or overmold 18. In this way, component 14 can be also encapsulated in premold 16 and/or overmold 18, for various advantages resulting therefrom, including protection from ambient conditions and permanent fixation of the relative positions of leadframe 10 and component 14. In the illustrated embodiment of the invention, ferrite noise filter component 14 is installed on electrical contacts 32, 34 and 36, prior to the formation of overmold 18, and is then encapsulated in overmold 18. Ferrite noise filter component 14 is thereby protect with a plastic encasement, and is permanently fixed in position on leadframe 12.

If ferrite noise filter component 14 is loosely positioned on electrical contacts 32, 34 and 36, it may become displaced as intermediate structure 40 is placed in the mold (not shown) for the application of overmold 18 to intermediate structure 40. Difficulties can result in closing the mold, or the quality of the subsequent formation of overmold 18 may be unacceptable.

The present invention provides structure whereby a component 14, such as ferrite noise filter component 14, or other components 14, can be applied to one or more component receiving projections 60, such as electrical contacts 32, 34 and 36. A single such projection 60 is shown in greater detail in the enlarged drawings of FIGS., 3, 4 and 5; however, it should be understood that in the embodiment illustrated, each contact 32, 34 and 36 is similarly constructed. Further, component receiving projection 60 need not be formed as an electrical contact 32, 34 or 36. Instead, projection 60 may be formed as part of another portion of leadframe 10, or can be separately provided on leadframe 10 for the specific and sole purpose of receiving and retaining a component 14 during premolding/overmolding processes. Providing contacts 32, 34 and 36 as component receiving projections 60, for the purpose of mounting a ferrite noise filter component 14 thereon, is a particularly advantageous use of the present invention.

Projection 60 includes a proximal end 62 connected to central frame 30, and a distal end 64 remote from central frame 30. Projection 60 is a monolithic structure formed in the stamping of leadframe 10. Projection 60 is subsequently formed into a multi-layer structure, including a base 66 and an overlying biasing member 68. Biasing member 68 is joined to base 66 along a fold 70. Base 66 has lateral edges 72 and 74. Lateral edge 72 extends the length of base 66 on one side thereof, whereas lateral edge 74 extends from central frame 30 to fold 70 on the opposite side of base 66. Fold 70 is formed such as to define a shoulder 76 that extends laterally of edge 74.

A distal segment 82 (FIG. 3) of biasing member 68 is thus joined to base 66 along fold 70, and through base 66 is anchored to central frame 30. A proximal segment 84 of biasing member 68 extends from distal segment 82 toward central frame 30, and also generally overlies base 66. However, except for its contiguous formation from distal segment 82, proximal segment is not otherwise connected to base 66. As thus shaped, proximal segment 84 operates as a leaf spring, allowing sidewise deflection thereof, and providing a lateral biasing force when so deflected. To allow sidewise deflection thereof, proximal segment 84 has an undercut 86 on the opposite side thereof from the side against which the lateral deflection force is accommodated. As mentioned previously, proximal segment 84 generally overlies base 66, but also includes a protuberance 88 at the end thereof. Protuberance 88 extends laterally from proximal segment 84, and includes an angular edge surface 90 from proximal segment 84 to the tip of protuberance 88. Protuberance 88 projects beyond edge 72 of base 66 when proximal segment 84 is in a non-deflected condition. Shoulder 76 operates in cooperation with biasing member 68 to function as a locking means for securing component 14 on projection 60, as will be described more fully hereinafter.

Component 14 has an inner face 92 and an outer face 94, with one or more holes 96 extending between surfaces 92 and 94. One hole 96 is provided for each component receiving projection 60, and in the embodiment illustrated, three holes 96 are provided in component 14, one for each contact 32, 34 and 36. Each hole 96 is of a diameter approximately the width of base 66 and shoulder 76 for projection 60 that it will receive, as will be described hereinafter. The thickness of component 14, from face 92 to face 94, at and around each hole 96 is only minimally less than the length of edge 74, so that component 14 will fit snuggly between central frame 30 and shoulder 76.

Figure 3:
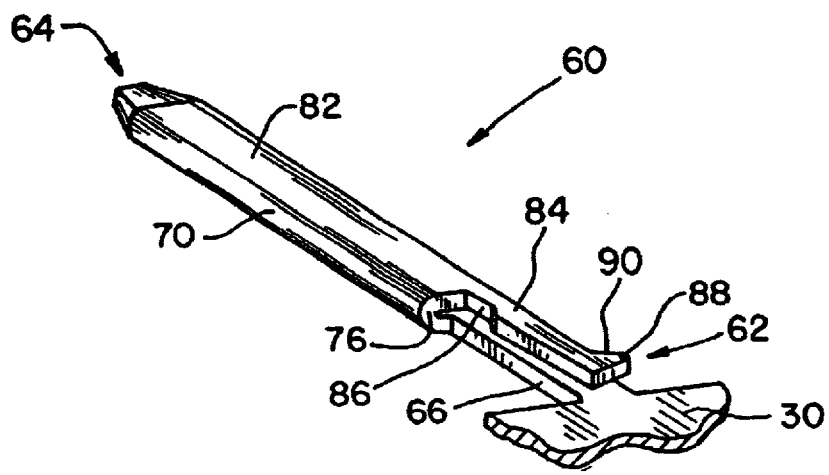
FIG. 3 is an enlarged perspective view, in partial cross-section, of one of the contacts on the leadframe shown in FIGS. 1 and 2.

In using a leadframe 10 of the present invention to manufacture a leadframe assembly 12, central frame 30, including contacts 32, 34 and 36 are stamped or otherwise formed from suitable material. Each contact 32, 34 and 36 forms a component receiving projection 60, and during initial stamping of lead frame 10 each includes base 66 and biasing member 68 thereof in side by side relation. Biasing member 68 is folded at fold 70 so as to overlie base 66 as illustrated in FIG. 3. Bending the material on fold 70 creates shoulder 76.

Figure 4:
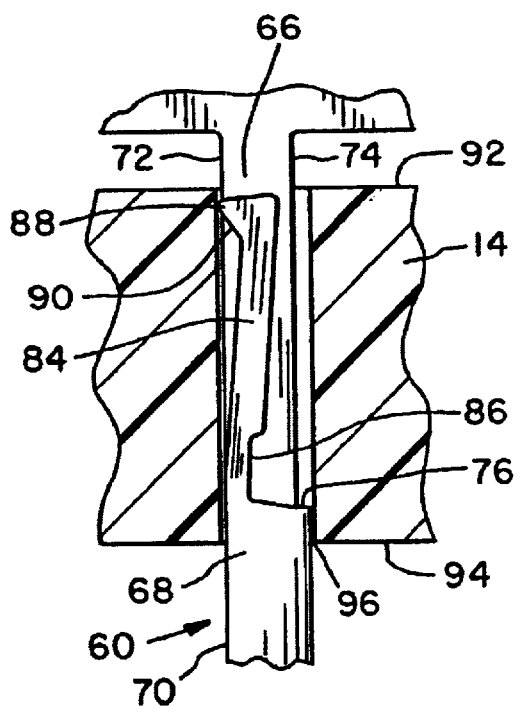
FIG. 4 is an enlarged cross-sectional view of the contact shown in FIG. 3, illustrating partial installation of a component on the contact.
Figure 5:
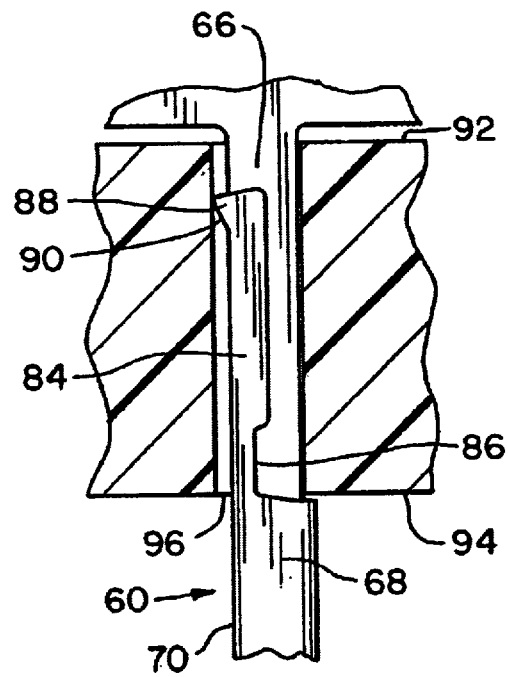
FIG. 5 is an enlarged cross-sectional view similar to FIG. 4, but illustrating full installation of the component on the contact.

Component 14 can be assembled on leadframe 10 before or after formation of premold 16. In the embodiment illustrated, premold 16 is first formed, in known manner. A side of outer frame 38 is removed, allowing ferrite noise filter component 14 to be slid onto contacts 32, 34 and 36. As component 14 is slid along contacts 32, 34 and 36, inner face 92 encounters surface 90. Continued application of force causes proximal segment 84 to deflect as shown in FIG. 4, thereby allowing component 14 to be slid fully onto contacts 32, 34 and 36. As outer face 94 moves beyond shoulder 76, and component 14 is released from any holding or positioning force, biasing member 68, through leaf spring action of proximal segment 84, applies biasing force to the inner surface of hole 96. Component 14 is held against edge 72, between central frame 30 and shoulder 76, as illustrated in FIG. 5. Component 14, therefore, will not easily fall off contacts 32, 34 and 36, and is held in position for the subsequent formation of overmold 18, which can be designed to also encapsulate component 14. If necessary, before the formation of overmold 18, component 14 can be removed by applying side force thereto sufficient to deflect proximal segment 84, allowing outer face 94 to clear shoulder 76.

The present invention provides a simple and effective structure whereby a component is retained on a leadframe, allowing the component to be included in the premold or overmold application. Manufacture of a leadframe assembly including the leadframe and component is thereby facilitated.

Variations and modifications of the foregoing are within the scope of the present invention. It is understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. The claims are to be construed to include alternative embodiments to the extent permitted by the prior art.

Various features of the invention are set forth in the following claims.

What is claimed is:

1. A leadframe comprising:
    a central frame;
    at least one component receiving projection from said central frame;
    a biasing member associated with said component receiving projection adapted and arranged to operate on a component installed on said component receiving projection; and
    locking means associated with said biasing member to inhibit movement of said component on said component receiving projection under biasing influence of said biasing member.

2. The leadframe of claim 1, said biasing member being a leaf spring having a lateral protuberance.

3. The leadframe of claim 1, said component receiving projection including a base, and said biasing member overlying a portion of said base.

4. The leadframe of claim 3, said biasing member and said projection being monolithic.

5. The leadframe of claim 4, said biasing member and said projection having proximal ends near said central frame, and distal ends remote from said central frame, said proximal end of said projection joined to said central frame, and said proximal end of said leaf spring being separate from said central frame.

6. The leadframe of claim 5, said distal ends of said biasing member and said projection being joined, and said proximal end of said biasing member being separated from an underlying portion of said projection.

7. The leadframe of claim 6, said proximal end of said biasing member having a protuberance extending laterally beyond an underlying portion of said projection.

8. The leadframe of claim 1, including a plurality of said component receiving projections.

9. The leadframe of claim 8, each said projection including a biasing member associated therewith adapted and arranged to operate on a component installed on said component receiving projection.

10. The leadframe of claim 9, said component receiving projections being electric terminals.

11. The leadframe of claim 1, said component receiving projection including a base, said base and said biasing member being contiguous, and said biasing member being folded over said base.

12. The leadframe of claim 1, including an outer frame at least partially surrounding said central frame, and at least one bridge between said outer frame and said central frame, for rigidifying said central frame.

13. A leadframe assembly, comprising:
   a leadframe including a central frame, and at least one component receiving projection from said central frame;
   a component installed over said component receiving projection;
   a biasing member associated with said component receiving projection adapted and arranged to operate on said component installed on said component receiving projection; and
   locking means associated with said biasing member to inhibit movement of said component on said component receiving projection under biasing influence of said biasing member.

14. The leadframe assembly of claim 13, said component having a hole therethrough for sliding onto said component receiving projection.

15. The leadframe assembly of claim 14, said leadframe including a plurality of said component receiving projections, and said component including a corresponding number of said holes for sliding onto said component receiving projections.

16. The leadframe assembly of claim 15, said component receiving projections being electric terminals.

17. The leadframe assembly of claim 16, said component being a ferrite shield.

18. The leadframe assembly of claim 13, including a premold and an overmold, each surrounding selected portions of said leadframe.

19. A leadframe assembly comprising:
   a leadframe including a central frame, an outer frame at least partially surrounding said central frame and connected to said central frame by at least one bridge for reinforcing said central frame, and at least one electrical contact projecting outwardly from said central frame;
   said at least one contact being a monolithic structure having a base and a biasing member overlying said base, said biasing member connected to said base along distal segments thereof and formed to overlie said base along a fold, said biasing member having a proximal segment free from said base, and having a protuberance extending beyond and edge of said base;
   a shoulder formed at an end of said fold, said shoulder disposed laterally beyond an opposite edge of said base;
   a ferrite noise filter installed over said at least one contact, said filter having a hole minimally larger than said at least one contact and being disposed on said contact between said central frame and said shoulder; and
   said protuberance and said proximal segment of said biasing member biasing said filter to maintain engagement of said filter against said shoulder.

20. The leadframe assembly of claim 19, said leadframe including three said contacts, and said filter having three holes for sliding said filter over said contacts.

* * * * *